United States Patent [19]
Cadwallader et al.

[11] Patent Number: 5,917,329
[45] Date of Patent: Jun. 29, 1999

[54] SUBSTRATE TESTER HAVING SHORTING PAD ACTUATOR METHOD AND APPARATUS

[75] Inventors: Robert H. Cadwallader, Clinton Corners; Thomas Morrison, Pleasant Valley, both of N.Y.; Klaus Probst, Herrenberg, Germany; Brian J. Wojszynski, Hyde Park; William A. Yager, Salt Point, both of N.Y.

[73] Assignee: International Business Machines Corporation, Armonk, N.Y.

[21] Appl. No.: 08/840,836

[22] Filed: Apr. 17, 1997

[51] Int. Cl.[6] .................................................. G01R 31/02
[52] U.S. Cl. .......................................... 324/754; 324/761
[58] Field of Search .................................. 324/754, 757, 324/758, 761; 439/482

[56] References Cited

U.S. PATENT DOCUMENTS

| | | | |
|---|---|---|---|
| 2,341,602 | 2/1944 | Dewey | 78/96 |
| 2,664,860 | 1/1954 | Levetus | 121/38 |
| 2,966,721 | 1/1961 | Bordignon et al. | 29/27 |
| 3,032,331 | 5/1962 | Doty et al. | 269/34 |
| 4,139,189 | 2/1979 | Wietrzyk | 269/272 |
| 4,436,385 | 3/1984 | Fischer et al. | 350/529 |
| 4,438,984 | 3/1984 | Leppälä | 308/3.9 |
| 5,672,977 | 9/1997 | Yamada | 324/757 |
| 5,825,192 | 10/1998 | Hagihara | 324/757 |

*Primary Examiner*—Neil Abrams
*Attorney, Agent, or Firm*—Steven Capella

[57] ABSTRACT

An electrical contacting apparatus for testing a substrate (54) and having a principal axis includes an electrical contact pad, a guide plate (106), a supporting bridge (132), and a mechanism for providing a contact actuation force. The guide plate includes side edges with guide pins (108) extending radially outward from a center of each side edge. The electrical contact pad (114) is mounted and centered upon a top surface of the guide plate (106). The support bridge supports the guide plate to enable a pivotal movement of the guide plate about a point on the principal axis. Lastly, the contact actuation force mechanism provides a contact actuation force to a center of the bottom surface of the guide plate to maintain an equal force across the electrical contact pad in a direction of the principal axis, whereby the electrical contact pad provides a desired contacting force equally balanced across an entire contact area defined by an area of contact between the electrical contact pad and a substrate being contacted. The substrate (54) is to be clamped between test probes (52) and the contact pad (114).

16 Claims, 8 Drawing Sheets

SUBSTRATE TESTER HAVING SHORTING PAD ACTUATOR METHOD AND APPARATUS

CROSS-REFERENCE TO COPENDING APPLICATIONS

Copending U.S. patent applications Ser. No. 08/840,833, filed concurrently herewith, entitled "Locator Actuation Method and Apparatus", describes a method and apparatus for locating and positioning a substrate upon a surface; Ser. No. 08/840,835, filed concurrently herewith, entitled "Substrate Tester Method and Apparatus Having Rotatable and Infinitely Adjustable Locator Jaws", describes a locator actuation method and apparatus for locating and positioning a substrate during manufacture and testing thereof; and Ser. No. 08/840,834, filed concurrently herewith, entitled "Substrate Tester Location Clamping, Sensing, and Contacting Method and Apparatus", describes a glass ceramic substrate tester, all assigned to the assignee of the present invention, the disclosures of which are hereby incorporated by reference into the present application.

BACKGROUND OF THE INVENTION

1. Field of the Invention

This invention relates generally to a method and apparatus for testing networks of a multilayer ceramic substrate (MLC) during a manufacture thereof and, more particularly, to a shorting pad actuator adapted for use therewith.

2. Discussion of the Related Art

Substrate testers are known in the art for performing network integrity tests on substrates, such as multilayer ceramic substrates (MLCs). A substrate refers to a packaging unit that provides an interface between a semiconductor chip (e.g. a very large scale integrated (VLSI) circuit chip) and a higher level packaging unit (e.g., a printed circuit board). A network is generally defined by a set of one or more electrically connected common points on a substrate. Networks are used to distribute electrical signals and voltages externally and/or internally about the substrate in accordance with the requirements of a particular integrated circuit chip. Substrate testers are used during substrate manufacturing to guarantee that there are no process or design created defects (corresponding to opens or shorts) on a particular substrate being tested. Typically, a substrate tester performs a test using a particular contacting scheme. A test matrix scanner is then used to provide an electrical stimulus on each point of the networks contacted by the contacting scheme and then systematically scans the remaining points in the test matrix to guarantee all desired connections exist (opens test) and that there are no unwanted connections (shorts), as the case may be.

In current manufacturing techniques of MLC substrates, there is a need to improve the accuracy and cost structure of substrate locators in an effort to satisfy more stringent manufacturing process requirements. Conventional substrate locators require many moving parts which disadvantageously contribute to tolerance build-ups, inaccuracies, and thus higher manufacturing costs. Conventional substrate locators also use many high precision parts, which are not performance efficient or cost efficient for meeting the current manufacturing requirements. For example, multi-cam drive assemblies are exceedingly costly in terms of their use in the manufacturing process.

Current state of the art substrate locators furthermore include a number of moving parts, which may include parts such as precision cam slots, cam followers, gears, etc.. The moving parts contribute to a build up of tolerances. This build up of tolerances prevents a precise and absolute locating and positioning by the locator with respect to a centering of the substrate parts over or under a workstation, wherein the workstation requires extreme positioning accuracy and repeatability. The workstation may also include a high speed substrate tester (HSST) which has traditionally been characteristically large and slow.

Features on MLC substrate s are very small and in close proximity to one another. For example, any one particular MLC substrate may include more than one thousand pin or pad connections in an area on the order of one-quarter square inch of space, as can been realized in the current state of art for MLC substrates. It is thus very critical to align the substrate parts in a repeatable manner, for example, with respect to a testing and a placement of test contacts, or other processing and manufacturing options, such as chip placement, discrete wiring, etc.

In addition, in today's MLC substrate manufacturing environment, a wide variety of substrate sizes are manufactured. For testing of the various sized substrates, the substrate tester must undergo a product changeover to accommodate a substrate of a different size from that which it was previously set up for. This has lead to the use of expensive multiple hardware for making a product changeover, further resulting in a lengthy and inefficient changeover process.

Yet another aspect of known substrate testers is that the testers for implementing shorting pad testing fail to equally distribute or align forces across an array of network terminals on a substrate under test. In other words, the contact platens used for providing necessary forces are generally not parallel with each other, thus leading to an uneven distribution of contacting force upon the substrate under test. In addition, the substrate under test may be supported in such a way that undesirably cocks or tilts the substrate. Contacting forces applied under the above conditions are thus not applied evenly across an entire contacting area of the substrate under test. Another example of an uneven distribution of contacting forces occurs if the substrate under test varies in thickness from one edge to another. The unevenness leads to marginal test results, thereby producing an increased probability of undesired detection of false open circuitry.

Furthermore, in addition to the above discussion, physical space limitations of the tester apparatus, and more particularly, for a substrate locating and clamping mechanism and a shorting pad actuator, are of concern. A large pressure is generally required for use in shorting pad testing of a substrate. It is thus desirable to have the shorting pad actuator of the substrate tester and the locating and clamping mechanism as close to one another as possible to enable the large pressure to develop while accurately positioning and locating the substrate under test.

Referring now to FIG. 1, the problem of a test contact head A1 being out-of-parallel with a substrate A2 under test is exemplified and briefly discussed. As shown, a force F1 is applied to the test head A1. A substrate A2 under test is supported upon a fixed product support A3. The test head A2, however, does not contact the substrate A2 under test evenly because of the test contact head A1 being out-of-parallel with the substrate support A3. Such an out-of-parallel condition (as noted by A4) undesirably leads to erroneous test results, for example, since the networks on the substrate A2 may not all be properly contacted.

It would thus be desirable to provide a shorting pad actuator which overcomes the out-of-parallel problems as discussed above, while requiring a minimum amount of space in the tester apparatus.

SUMMARY OF THE INVENTION

It is an object of the present invention to overcome problems as discussed above relating to an out-of-parallelism condition between a contacting pad and a substrate being contacted and for ensuring a desired contacting force across a contacting area.

In accordance with the present invention, a shorting pad actuator mechanism is provided in a confined area, furthermore on a movable slide, and advantageously provides equally distributed and aligned contacting forces.

In accordance with the present invention, a testing mechanism is provided for applying a uniform controlled force to a shorting pad for contacting a substrate under test. In addition, a method is provided for the shorting pad to be easily moved into and out of contacting engagement against a substrate under test and retracted. The shorting pad actuation mechanism according to the present invention includes a diaphragm for minimizing a height requirement of the shorting pad actuation mechanism. Furthermore, the shorting pad actuator mechanism is easily removed, as may be required, for example, for substitution of an alternate test head assembly.

In accordance with the present invention, an electrical contacting apparatus having a principal axis includes an electrical contact pad, a guide plate, a supporting bridge, and a mechanism for providing a contact actuation force. The guide plate includes side edges with guide pins extending radially outward from a center of each side edge. The electrical contact pad is mounted and centered upon a top surface of the guide plate. The support bridge supports the guide plate to enable a pivotal movement of the guide plate about a point on the principal axis. Lastly, the contact actuation force mechanism provides a contact actuation force to a center of the bottom surface of the guide plate to maintain an equal force across the electrical contact pad in a direction of the principal axis, whereby the electrical contact pad provides a desired contacting force equally balanced across an entire contact area defined by an area of contact between the electrical contact pad and a substrate being contacted.

A substrate tester, a method of contacting, and a method of testing a substrate are also disclosed.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 1:
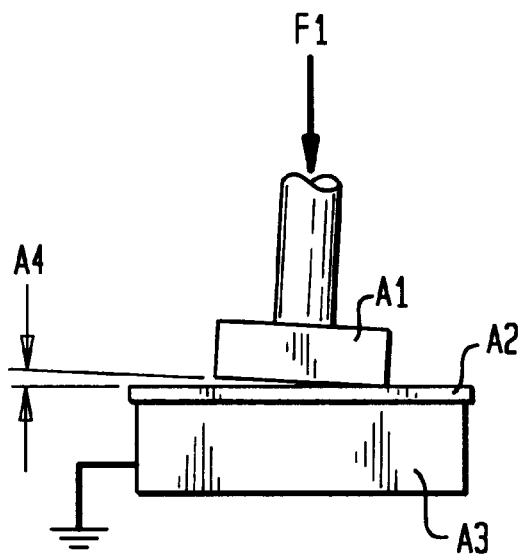
FIG. 1 illustrates an out-of-parallel problem which occurs with prior known testers.
Figure 2:
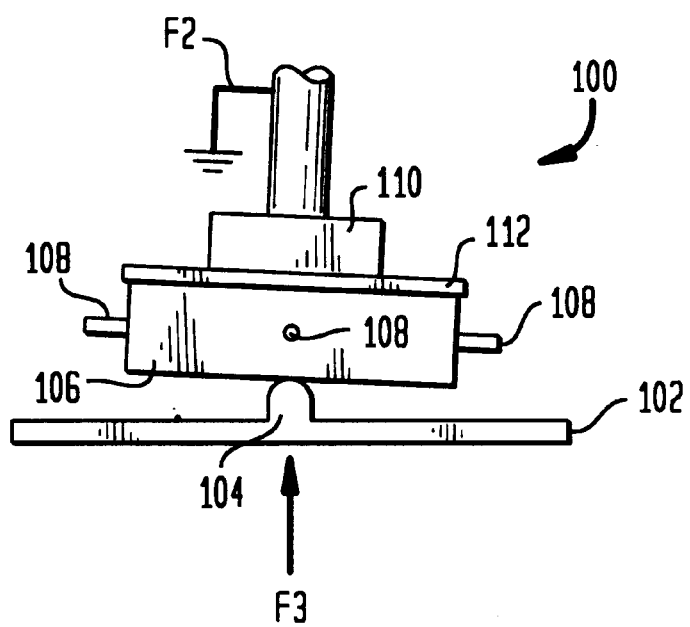
FIG. 2 illustrates elements of a method and apparatus according to the present invention for solving an out-of-parallel problem.

Referring now briefly to FIG. 2, an underlying concept for the shorting pad actuator method and apparatus according to the present invention shall be briefly discussed. The shorting pad actuator 100 includes a piston 102 having a balancing center point 104 thereon, wherein the balancing center point 104 includes a raised bullet portion having a rounded contacting end. A guided substrate support platen 106 is secured in a manner for enabling a pivotal movement using guide pins 108 (only 3 of 4 shown in FIG. 2), to be discussed in further detail herein below. A downward force F2 is applied to a test contact head 110 onto a substrate 112 under test being supported upon the guided platen 106. Since the guided platen 106 is secured in a manner for enabling a pivotal movement thereof, any out-of-parallel condition between the test contact head 110 and the substrate 112 under test being supported upon the guided platen 106 shall be eliminated. In addition, an upward force F3 is exerted upon piston 102, wherein piston 102 further includes a diaphragm operated piston positioned below the substrate 112 under test for the purpose of assisting in the elimination of the out-of-parallel condition, as shall be better understood from the further detailed discussion herein below.

Figure 3:
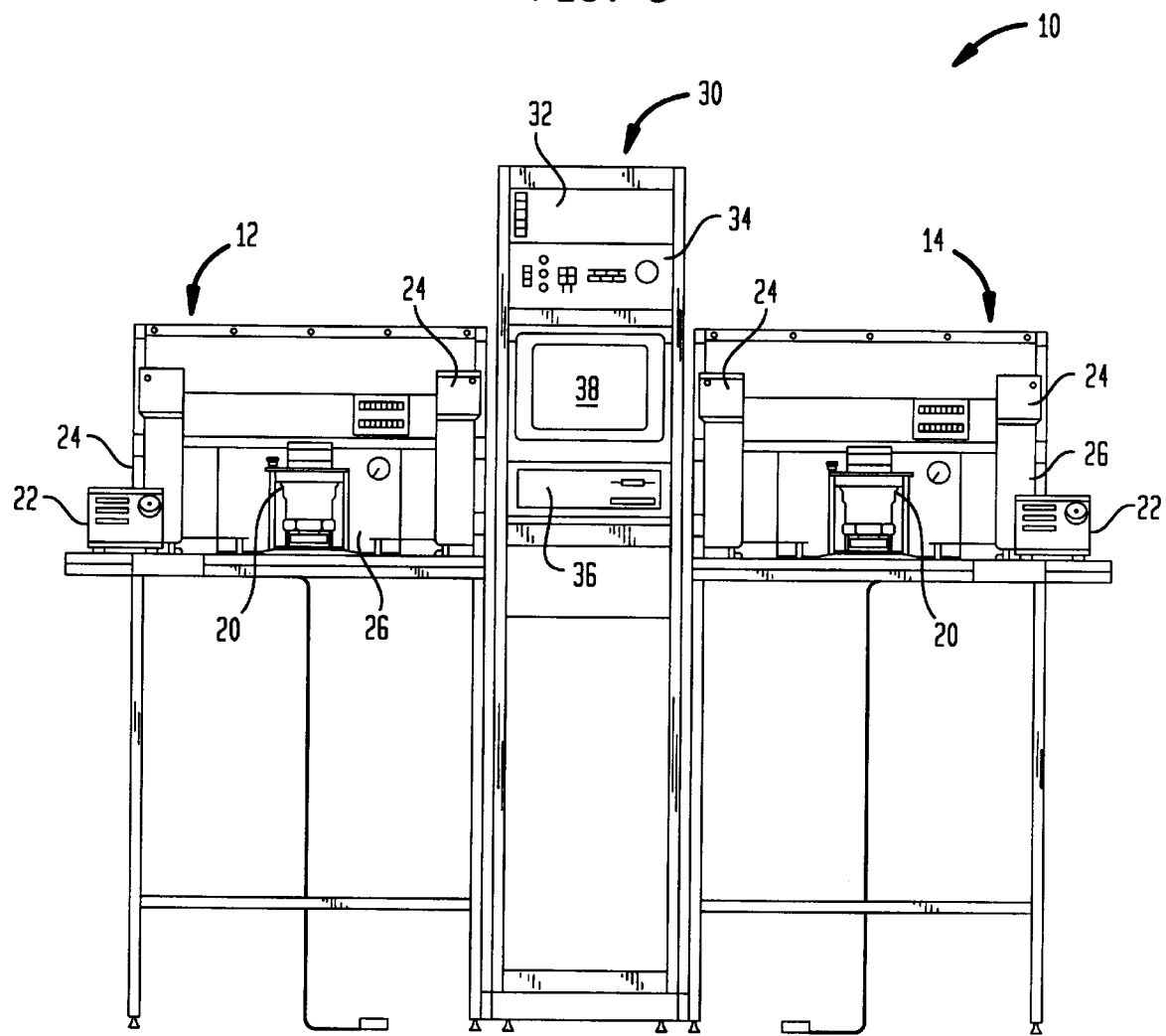
FIG. 3 illustrates a universal substrate tester in accordance with the present invention.

Referring now to FIG. 3, a universal substrate tester 10 is shown which includes first and second test stations 12 and 14, respectively. First and second test stations 12 and 14, are essentially identical test stations which can be individually set up for the testing of the same type of particular substrate or may be set up for the testing of different types of substrates. That is, the product to be tested includes any given substrate having a size dimension and a set of internal/external networks. Each test station of the substrate tester 10 is set up at any given time for the testing of a particular substrate. Furthermore, each test station 12 or 14 can include a mechanical handler 20, an operator panel 22, light curtains 24, and a pneumatic panel 26. The light curtains 24 are included for the purpose of operator safety. When an operator reaches into a designated area of the test station, as defined by the light curtains, pneumatic power is terminated. That is, pneumatic power is removed from the handler when loading and unloading a substrate manually. Furthermore, when an operator reaches into the tester, power to the handler is removed to protect the operator from injury. The pneumatic panel or unit allows air to be brought to the cylinders which drive various mechanisms in and out, as shall be discussed herein below. For purposes simplicity, the discussion to follow shall refer to test station 12, however, the same is equally applicable with respect to test station 14.

A control cabinet 30 is used to house various electronic components of the tester 10. For example, control cabinet 30 contains a test engine 32, a main power supply 34, and a computer 36 with display 38 and keyboard (not shown). Test engine 32 provides an electrical stimulus for application on each point of the substrate networks contacted by a contacting scheme. Test engine 32 further systematically scans remaining points in a test matrix to guarantee all desired connections exist (opens test) and that there are no unwanted connections (shorts), as the case may be, for tester 10. Power supply 34 provides various voltages and signals as may be required for a particular testing operation by tester 10. Control cabinet 30 may also include an appropriate electronic interface panel (not shown).

Referring still to FIG. 3, computer 36 can be programmed for performing desired functions in accordance with the present invention as discussed further herein below. The particular programming of computer 36 can be accomplished using programming and interfacing techniques known in the art, thus the particular programming of computer 36 and associated device interfacing is not discussed in detail herein. In short, computer 36 performs desired computational and control functions of a testing operation of tester 10 in accordance with the present invention. Computer 36 thus receives input signals on respective inputs and provides output signals on corresponding outputs, as may be required for a particular substrate testing operation.

Figure 4:
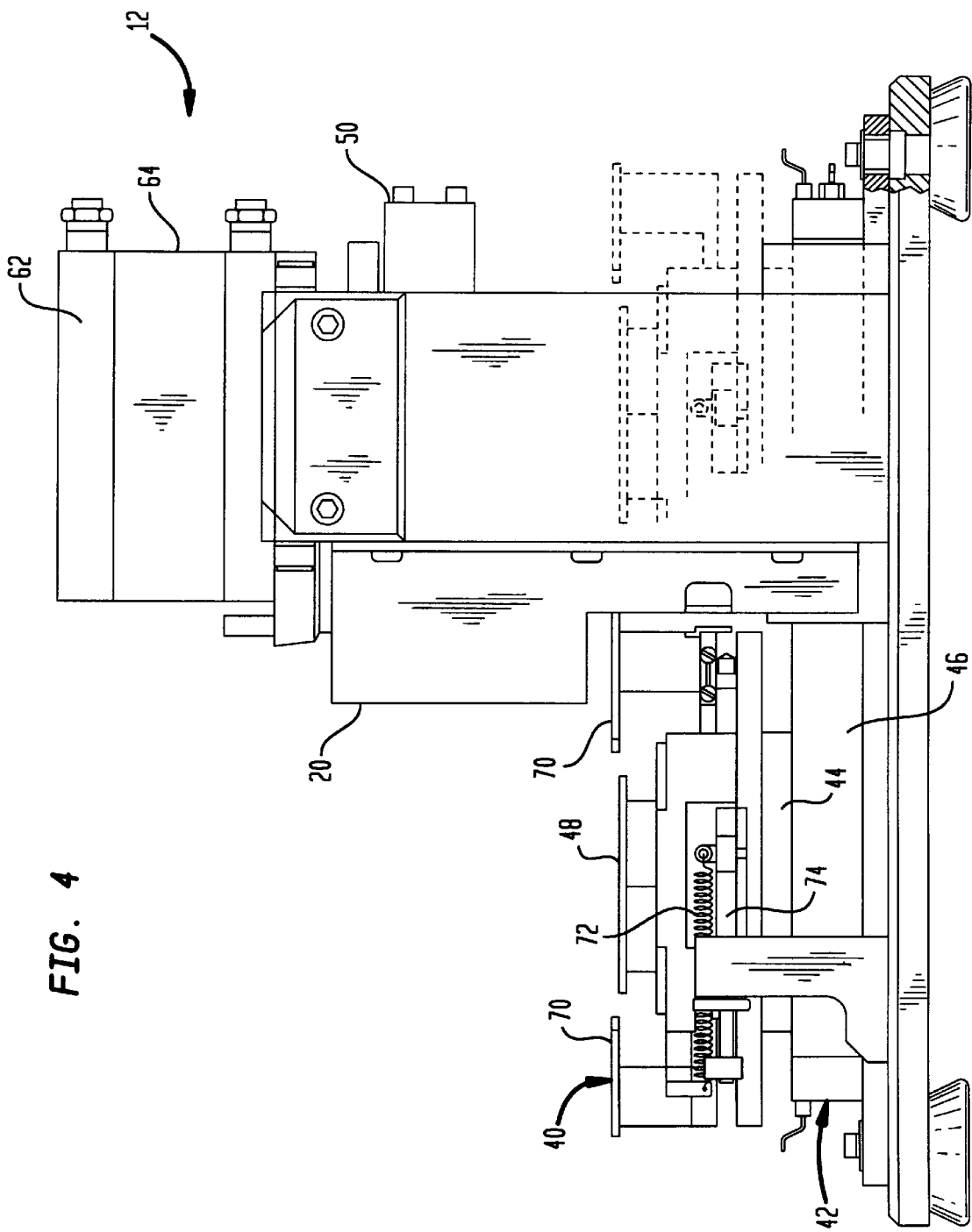
FIG. 4 illustrates a side view of a test station and mechanical handler of the substrate tester according to the present invention.

Turning now to FIG. 4, test station 12 and handler mechanism 20 shall be discussed in further detail. Test station 12 includes a four-point locator mechanism 40, such as is described in copending U.S. applications, Ser. No. 08/840,833, filed concurrently herewith, entitled "Locator Actuation Method and Apparatus", (Attorney docket FI9-97-020), which describes a method and apparatus for locating and positioning a workpiece, e.g. a substrate, upon a surface; and Ser. No. 08/840,835, filed concurrently herewith, entitled "Substrate Tester Method and Apparatus Having Rotatable and Infinitely Adjustable Locator Jaws", which describes a locator actuation method and apparatus for locating and positioning a substrate during manufacture and testing thereof. The four-point locator mechanism 40 is mounted upon a slide mechanism 42. Slide mechanism 42 includes a precision slide 44 and pneumatic drive unit 46 for moving four-point locator mechanism 40 between a load position (as shown in solid lines of FIG. 2) and a testing position (as shown in phantom lines of FIG. 2) within test station 12. Computer 36 can be used, in part, for controlling precision slide 44 and pneumatic drive unit 46 in a suitable manner for moving four-point locator mechanism 40 between the load position and the testing position in accordance with the particular requirements of a testing operation. A workpiece platen 48 is provided for supporting a workpiece or substrate thereon during a testing operation. Platen 48 thus acts as a support surface.

Figure 5:
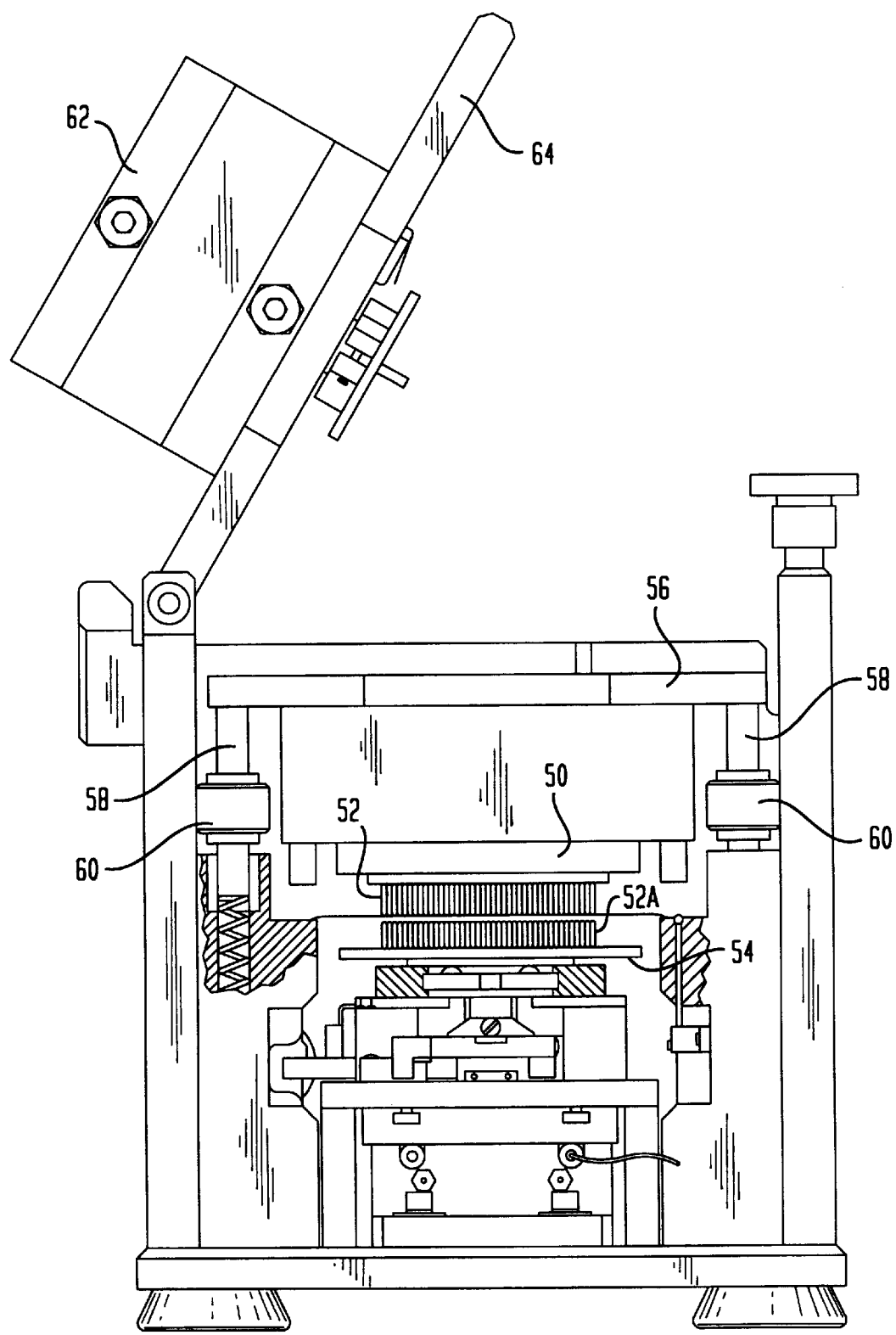
FIG. 5 illustrates a rear view of the test station and mechanical handler of FIG. 4.

Turning now to rear view FIG. 5, some portions thereof being shown in partial cut-away view, other features of test station 12 shall now be briefly described. Test station 12 further includes a substrate top contacting test head or contractor 50. Contactor 50 can include, for example, a buckling beam probe test head assembly. Test head assembly 50 includes test probes 52 for contacting with network test pads (not shown) on a top surface of product substrate 54, as illustrated using phantom lines 52A, as required for a particular substrate testing operation. Buckling beam probe assemblies are known in the art and thus not further discussed herein. Contactor 50 is mounted on a bridge support plate 56 which is enabled for movement up and down on posts 58 and bearings 60. The rear view of FIG. 5 further illustrates product substrate 54 in test station 12 resting upon the workpiece platen 48, wherein workpiece platen 48 includes a shorting pad platen according to the present invention. An air cylinder 62 is mounted to lid member 64 of the mechanical handler 20 for providing an appropriate air supply or vacuum as may be necessary for lowering or raising contactor 50 according to a particular testing operation.

Referring once again to FIG. 4, the mechanical handler 20 is shown in the load position with the four point locator mechanism 40 out from under the contactor 50 and air cylinder 62. For a testing operation, a substrate to be tested is first loaded upon platen 48 as follows. In the load position, locator jaws 70 (which are normally held closed by spring 72) are held open by an adjustable stop 74. In addition, the locator jaws 70 are held open by a prescribed amount for allowing product substrate 54 to be inserted between the locator jaws 70 and rested upon platen 48, with a desired clearance. When product substrate 54 is in place on platen 48, locator jaw mechanism 40 which is mounted on precision slide 44 is driven toward the right by pneumatic drive unit 46 until it is positioned under the contactor 50 (as shown in phantom lines in FIG. 4). Once the locator jaw mechanism 70 moves away from the adjustable stop 74, the locator jaws are disposed in a closed position for locating and securely clamping substrate 54 with respect to a true center of the workpiece platen 48. Air cylinder 62 is then used to drive contactor 50 downward, wherein contactor probes 52 make contact with the product 54. An electrical testing is then performed in accordance with a particular testing operation for the substrate under test.

Figure 6:
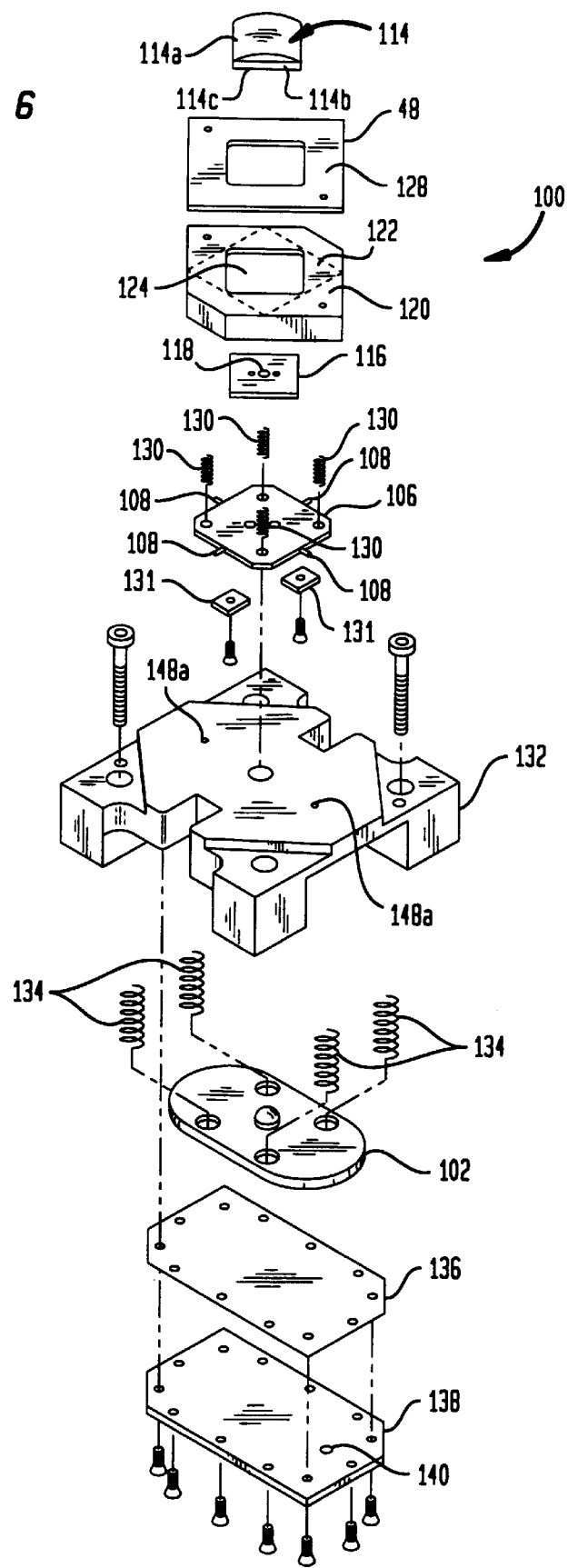
FIG. 6 illustrates an exploded view of the shorting pad actuator mechanism according to the present invention.
Figure 7:
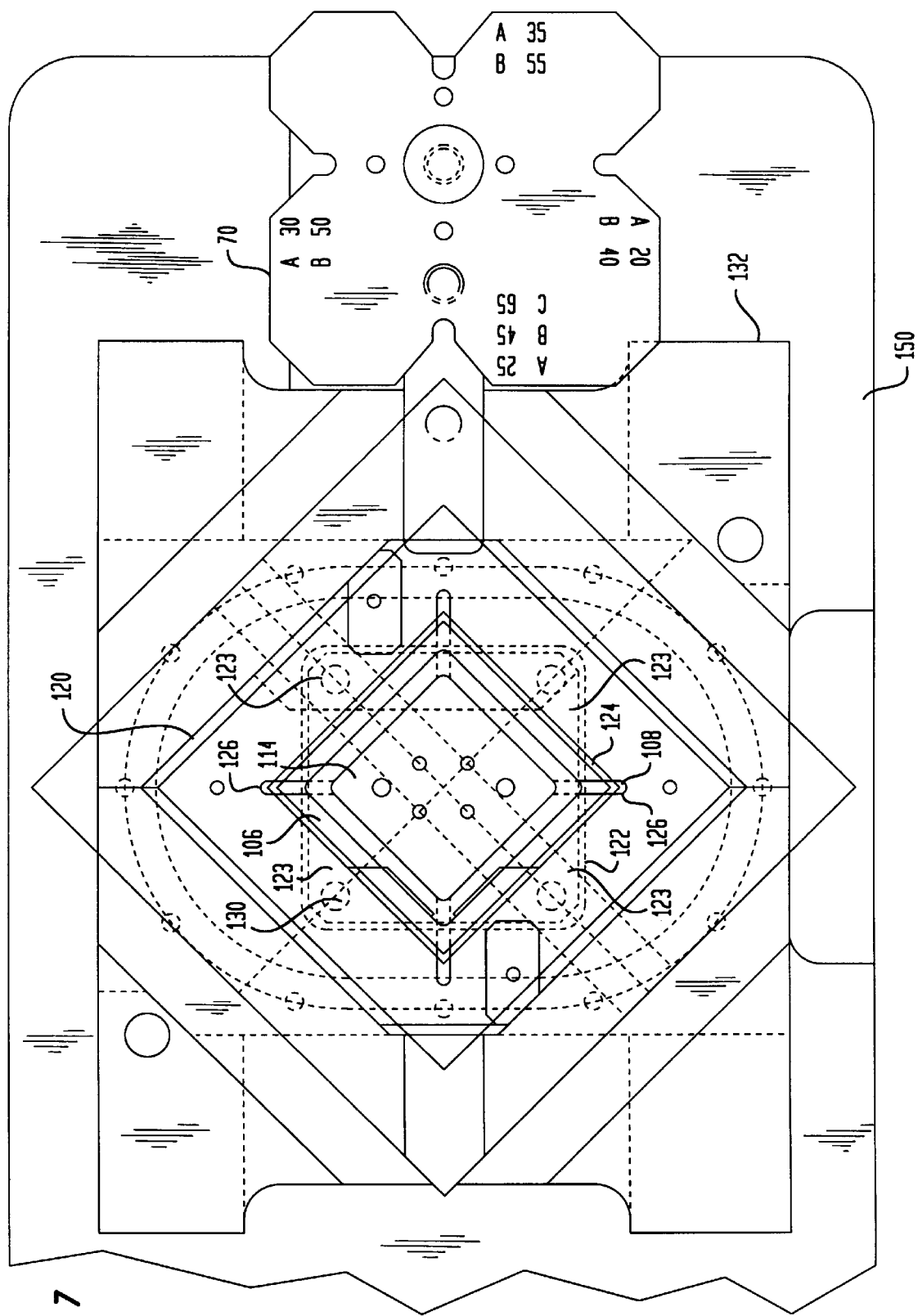
FIG. 7 illustrates a top view of the shorting pad actuator mechanism including hidden features according to the present invention.
Figure 8:
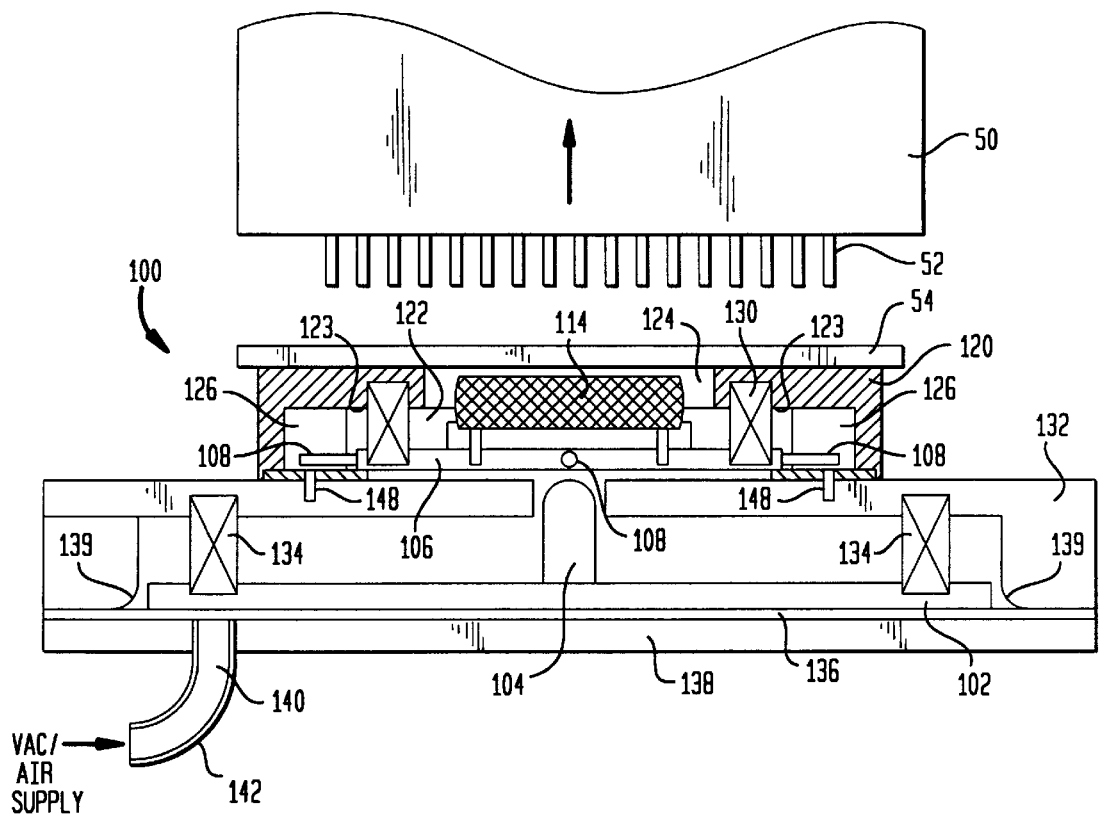
FIG. 8 illustrates the shorting pad actuation mechanism according to the present invention in a first stage of use.

Detailed features of the shorting pad actuation mechanism 100 according to the present invention shall now be further described herein with reference to FIGS. 6, 7 and 8. FIG. 6 provides an exploded view of the shorting pad actuation mechanism 100. FIG. 7 provides a partial top view and FIG. 8 illustrates a side view in partial cross-section.

The shorting pad actuator mechanism 100 includes diaphragm operated piston 102 having a balancing center point 104. Shorting pad actuator 100 further includes a guided substrate support plate 106 having guide pins 108. A shorting pad 114 of the shorting pad actuator 100 includes a gold foil 114a wrapped around a generally square block of flexible material 114b, such as, including rubber for example. The flexible material 114b is further bonded to a metal base plate 114c, such as steel, using any suitable bonding material. Shorting pad 114 is held against a magnet plate 116 using, for example, a powerful permanent magnet 118 disposed, held, and positioned in the center of plate 116. Magnet plate 116 is fastened to metal guide plate 106 by means of the same magnet 118. Magnet plate 116 is further positioned upon guide plate 106 in a desired orientation, for example, with the use of suitable locator pins or dowels. Two dowels are shown positioned, one to the right and one to the left of magnet 118, on plate 116 for being received in corresponding apertures of guide plate 106.

The combination of shorting pad 114, magnet plate 116, and guide plate 106 (i.e., the three features acting as a single unit) is guided and free to move up and down within a cavity 122 of aperture block 120, further for providing any necessary out-of-parallel compensation or correction, to be discussed further herein below. Aperture block 120 further includes a top surface aperture 124 which is offset from the inner cavity 122 by a given amount, preferably on the order of forty-five (45°) degrees. The offset nature of the inner cavity 122 and the top surface aperture 124 serves to create four inner support regions or surfaces 123 (see FIGS. 7 and 8) on an underside of the top of aperture block 120. Inner support surfaces 123 occur in regions of the top surface of aperture block 120 corresponding to the corners of guide plate 106 when guide plate 106 is inserted within cavity 122, as shown in FIG. 8 and discussed further herein below. Guide pins 108, disposed and centered in side edges of guide plate 106, are adapted to fit into slots 126 formed in a vertical direction and centered within side walls of cavity 122. Cavity 122 is a generally square cavity within aperture block 120, wherein the cavity has a dimension slightly larger than the size of the guide plate 106. The guide pins 108 further keep the assembly from rotating in a direction perpendicular to the plane of the guide plate 106 within the cavity 122. In other words, guide pins 108 are included in the sides of guide plate 106 for being disposed in floating pivotal engagement within slots 126 of cavity 122 of aperture block 120 to allow an out-of-parallel freedom of movement and also keep the shorting pad assembly from rotating about an axis perpendicular to the main plane of the guide plate 106.

Referring still to FIGS. 6, 7 and 8, guide plate 106 with guide pins 108 are inserted into the slots 126 of aperture block 120 from an underside thereof. Compression springs 130 of suitable size and compression are inserted between support surfaces 123 on an underside of aperture block 120 and respective corners of guide plate 106. Suitable tabs 131 are used for maintaining guide plate 106 within cavity 122 of aperture block 120 during an assembly of shorting pad actuation mechanism 100.

An aperture platen 128 can be attached to a top of aperture block 120, wherein aperture platen 128 provides a support for a product or substrate 54 being tested. More particularly, aperture platen 128 provides a main support for a substrate placed thereon when the shorting pad actuator mechanism 100 is not actuated, i.e., when the shorting pad 114 is in a non-contacting or retracted position within aperture block 120. Aperture platen 128 provides a secondary support for a substrate placed thereon when the shorting pad actuator mechanism 100 is actuated, i.e., when the shorting pad 114 is in a substrate contacting or extended position within aperture block 120.

Briefly referring once again to FIGS. 4 and 5, the area in which the testing of a substrate takes place is a confined area. As will be discussed herein below, the present invention preferably includes a diaphragm operated piston which is able to clear the precise clamping mechanism. That is, the diaphragm operated piston actuation does not interfere with the operation and actuation of the four-point locator mechanism. In addition, a diaphragm operated piston is preferred over a standard piston (i.e., using an "O" ring), since a static friction developed from the "O" ring seal of a standard piston would fail to provide a true indication of an exact pressure required to deflect the shorting pad. In a similar manner, a diaphragm operated piston can also be used for implementing a piston driven test head assembly which is used to probe a top surface of the substrate under test.

Referring now once again to FIGS. 6 and 8, diaphragm operated piston 102 includes balancing center point 104. Piston 102 is disposed for mounting to an underside of a main support bridge 132. A set of compression springs 134 are provided between piston 102 and the underside of support bridge 132. A diaphragm 136 and diaphragm base plate 138 are included, as shown. Diaphragm 136 is attached to base plate 138 in any suitable manner about a perimeter thereof to enable an inflating and deflating of diaphragm 136. Diaphragm 136 comprises any suitable diaphragm material, for example, rubber. Diaphragm base plate 138 further includes a suitable air/vacuum port 140. Inside corner edges 139 of support bridge 132 are rounded for allowing a gentle flexing of diaphragm 136 at the corner edges when diaphragm 136 is inflated. Main support bridge 132 is mounted upon a support plate 150 (FIG. 7) using suitable fasteners.

When actuated, the shorting pad 114 is pushed into contact with conductive pads (not shown) on a bottom surface of the product or substrate 54 using pneumatic pressure. An air supply/vacuum line 142 introduces a desired air pressure through port 140 in diaphragm base plate 138. A positive air pressure causes rubber diaphragm 136 to expand and move piston 102 upwards. As piston 102 moves upwards, center point 104 contacts and drives the guide plate 106 upwards. Compression springs 134 return the guide plate 106 and the piston 102 to the non-actuated position when diaphragm 136 is deflated. Deflating of diaphragm 136 can be accomplished using a negative air pressure on line 142.

In operation, referring now to FIGS. 8, 9 and 10, the shorting pad actuator mechanism 100 shall now be described, wherein any out-of-parallel condition, which may otherwise exist, is advantageously compensated for in accordance with the present invention.

A substrate probing and testing operation begins with the placement of substrate 54 within the positioning and locating mechanism 40. The handler mechanism 20 is then operated to advance the substrate to within the test station 12, from the load position to the probing or testing position (as shown in phantom lines in FIG. 4), wherein substrate 54 is thereby precisely positioned for a testing operation by positioning and locating mechanism 40. Referring now to FIG. 8, when substrate 54 is initially loaded and positioned within test station 12, contactor assembly 50 with probes 52 is in a non-contacting position above the substrate 54. In the non-contacting position, contactor assembly 50 is in alignment with and positioned for a top side probing of substrate 54. In addition, when substrate 54 is initially loaded and positioned within test station 12, the shorting pad 114 of actuator mechanism 100 is in a non-contacting position. That is, shorting pad 114 is not in contact with the underside surface of substrate 54. Piston 102 is in a non-actuated position also.

Figure 9:
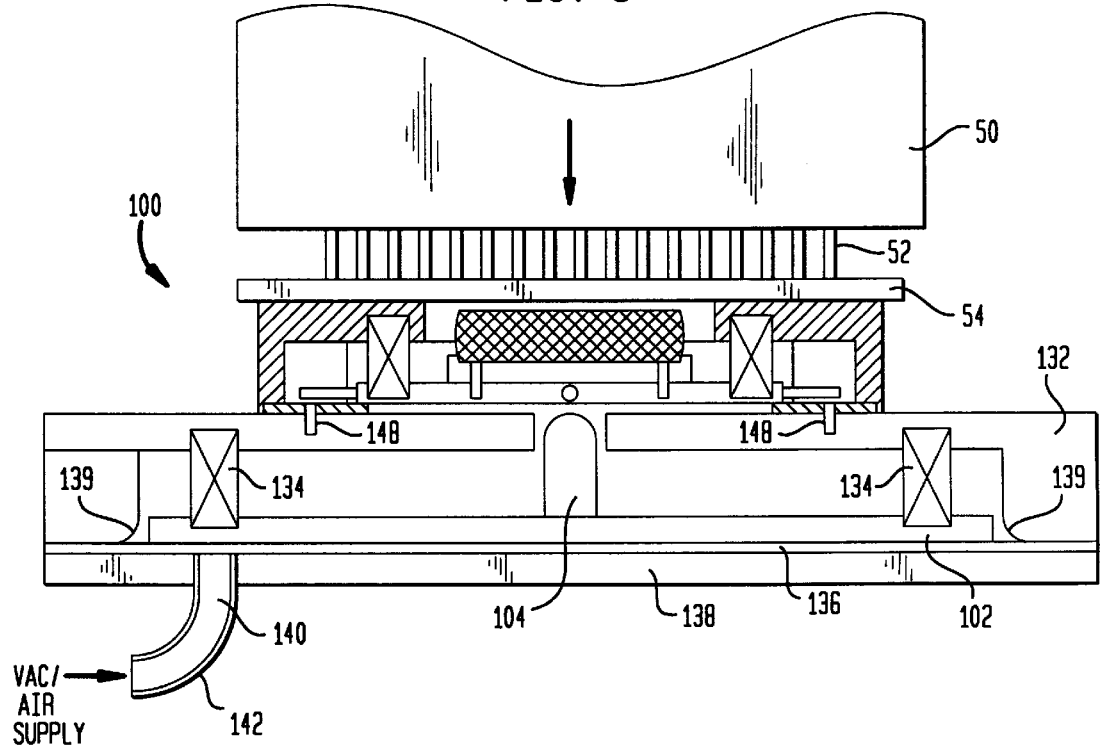
FIG. 9 illustrates the shorting pad actuation mechanism according to the present invention in a second stage of use.

Referring now to FIG. 9, after substrate 54 is precisely located and positioned by mechanism 40, the probing of substrate 54 continues as follows. Contactor assembly 50 is lowered from its initial rest position and brought into probing contact with the top surface of substrate 54. That is, contactor assembly 52 is appropriately controlled to move in the downward direction with probes 52, until the probes 52 are compressed against the product. Contact probes 52 thereby make probing contact with corresponding networks, as appropriate for a particular substrate, in preparation for performing a first test with respect to the networks of substrate 54. Probing contact with networks of substrate 54 is further characterized by contacting electrical terminal features on either top or bottom side for subsequent attachment of one or more semiconductor chips and/or socket pins (not shown), according to the particular substrate.

Figure 10:
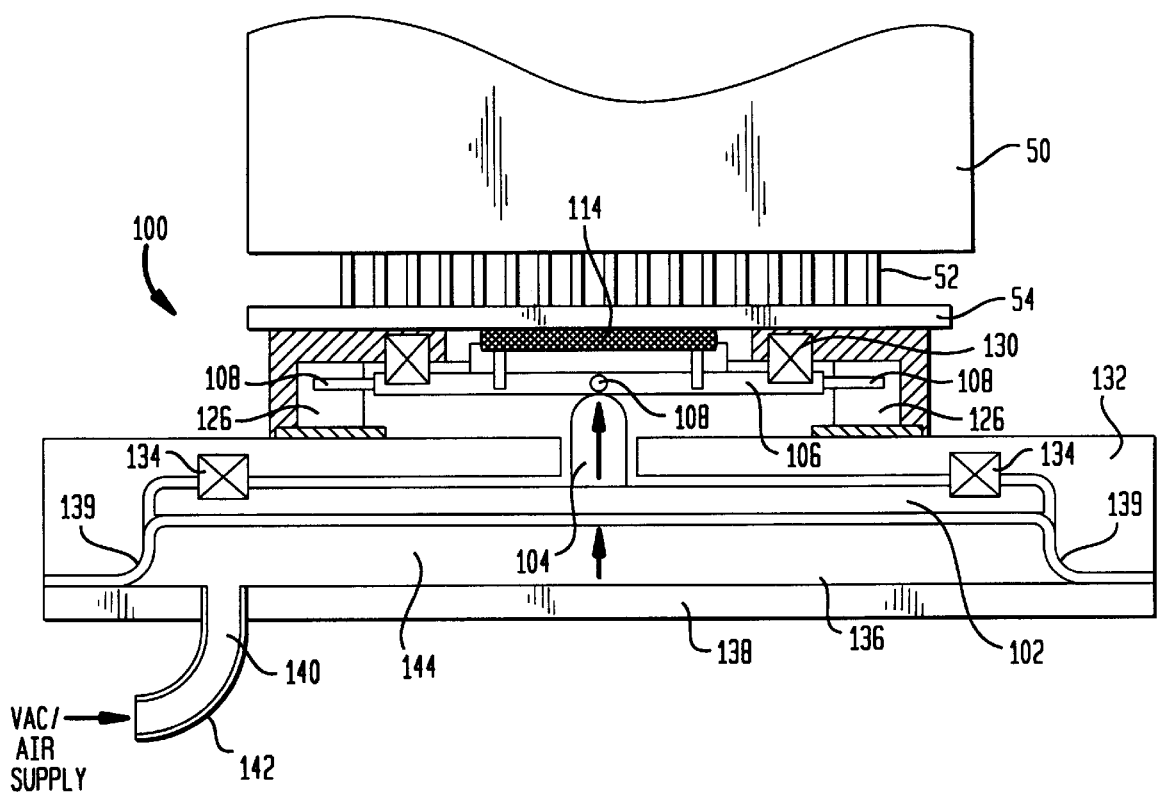
FIG. 10 illustrates the shorting pad actuation mechanism according to the present invention in a contacting stage of use.

In FIG. 10, the contactor assembly 50 and probes 52 remain in test contact position while shorting pad 114 is driven upwards against the underside of substrate 54. Shorting pad 114 is used to contact the underside of substrate 54 for performing a second test, appropriate for the particular substrate under test, by test station 12. Shorting pad 114 is driven upwards in the following manner. Diaphragm 136 is inflated and expands as a result of being pushed by air pressure via supply line 142. Inflation of diaphragm 136 causes piston 102 to be lifted upwards against the guide plate 106. Guide plate 106 is thereby advanced upwards to compress shorting pad 114 against test pads (not shown) on the underside of substrate 54. As a result of the balancing center point 104 of piston 102 and the guide pins 108 of guide plate 106, any out-of-parallel condition between the probe assembly 50, substrate 54, and shorting pad 114 is advantageously eliminated.

With reference still to FIG. 10, as discussed herein above, piston 102 is housed within a main support bridge 132 and cover plate 138. Sandwiched between support bridge 132 and cover plate 138 is also a thin flexible rubber diaphragm 136. Diaphragm 136 expands upward when compressed air is forced through port 140. The expanding diaphragm 136 in turn forces piston 102 upward. Balanced compression (i.e., force) springs 134 are compressed as piston 102 is driven upwards, wherein springs 134 return the piston 102 to an initial position when the air supply is evacuated through port 140. To enhance a return speed of the piston 102, vacuum (i.e., negative air pressure) is applied to quickly exhaust the chamber 144 formed between the expanded diaphragm 136 and the cover plate 138. Balanced compression springs 134 also insure uniform and/or parallel lift of the piston 102). The piston 102 is further guided by the inner boundary walls of support bridge 132.

Referring still to FIG. 10., housed in a precise manner upon guide platen 106 is shorting pad 114, as discussed herein above. Shorting pad 114 is shown fully compressed against the underside of substrate 54. With shorting pad 114 in proper electrical contacting engagement with substrate 54, an appropriate electrical test can now be performed by test station 12 in accordance with testing requirement of the particular substrate under test. The force required for making a reliable contact using shorting pad 114 is much greater than a required force for making individual electrical contacts using probes, for example. The larger required force for making reliable contact using shorting pad 114 is necessary since every infinite point within a contacting area of the underside of substrate 54 must be covered regardless if a terminal is there or not. That is, the force must be sufficient for enabling shorting pad 114 to cover the contacting area regardless of whether or not terminals populate the entire contacting area. In addition, the required force must be distributed uniformly across the entire contacting area, especially, with respect to covering a terminal array. The required force must also not be excessive, for example, in the case of thin substrate. In addition, thin substrates are subject to being broken, damaged, and/or destroyed if the force is not applied uniformly. The providing of a uniform contact force also minimizes an opportunity of having false opens (i.e., relating to continuity measurements).

As mentioned above, a large force is required to make and ensure that the number of potential contact points (ranging possibly in the thousands of contact points) are properly electrically contacted on the substrate 54 surfaces. A contact force is determined by taking the square inches of the contact area of the substrate times the supply line pressure (PSI) and dividing by the number of contact points or probes to find out if the proper force is available for each contact point on the substrate. The force of the piston 102 (expressed in square inches times pressure (i.e., xPSI)) therefore must exceed and/or match the required contact force. The required contact force is transferred through a single point on the top of the piston 102 at center balancing point 104. The upward movement and force of the piston 102 thus bears upon the exact center of the guided platen 106, lifting the platen 106 in concert with piston 102. Thus the force is applied with an equal balance across the entire area of the substrate covered by the shorting pad 114. Guided platen 106 also compresses springs 130 as platen 106 advances upward. Compression springs 130 enable the return of platen 106 to a lowered position when piston 102 is retracted. In addition, the guided platen 106 is guided precisely by the arrangement of X-Y guide pins 108 in slots 126 of aperture block 120. The guiding of platen 106, as discussed, keeps the platen central regardless of any "out of parallelism" between the substrate 54, the contact test head probe assembly 50, and the shorting pad 114 of shorting pad mechanism 100. In other words, the shorting pad thus acts as if on gimbals and never looses its center position. Furthermore, the guide platen 106 always equally distributes the contacting force regardless of any out-of-parallel condition, i.e., the guide platen distributes the force equally across the entire square of the shorting pad 114.

The test head probe assembly 50 and the shorting pad actuation mechanism 100 are thus each suitably controlled for providing a desired probing sequence. In addition, forces exerted between a probing test head or shorting pad and the substrate under test are appropriately applied for ensuring the making of reliable contact with the network terminals of the substrate under test.

The present invention thus provides a testing mechanism for applying a uniform controlled force to a shorting pad actuator. The uniform controlled force is applied such that the shorting pad can be moved in a controlled manner against the substrate (or device being tested) and retracted, eliminating any out-of-parallel condition. The actuating mechanism further includes a diaphragm actuated piston to minimize a height requirement of the shorting pad actuating mechanism. Furthermore, the shorting pad actuating mechanism can be easily removed, as may be necessary for implementation of an alternate test head assembly.

The sub-assembly housed within aperture block 120 is located precisely over the X-Y center of the shorting pad 114 and piston 102, for example, using suitable dowel pins 148 in mating apertures 148a (FIGS. 6, 8 and 9). The contained sub-assembly can thus be removed and easily replaced by an alternate sub-assembly containing a larger or smaller shorting pad to accommodate different substrates with larger or smaller chip site patterns.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention, as limited solely by the appended claims.

What is claimed is:

1. An electrical contacting apparatus having a principal axis, said apparatus comprising:

an electrical contact pad;

a guide plate having side edges with guide pins extending radially outward from a center of each side edge, wherein said electrical contact pad is mounted and centered upon a top surface of said guide plate;

means for supporting said guide plate to enable a pivotal movement of said guide plate about a point on the principal axis; and means for providing a contact actuation force to a center of the bottom surface of said guide plate to maintain an equal force across said electrical contact pad in a direction of the principal axis, whereby said electrical contact pad provides a desired contacting force equally balanced across an entire contact area defined by an area of contact between said electrical contact pad and a substrate being contacted.

2. The electrical contacting apparatus of claim 1, wherein said electrical contact pad includes a shorting pad, the shorting pad having a gold foil wrapped around a generally square block of flexible material and bonded to a magnetic base plate, and said guide plate includes a generally square shape, wherein the shorting pad is mounted upon said guide plate such that the corners of the shorting pad are offset from the corners of the guide plate by an amount on the order of forty-five degrees, further wherein the guide pins include X-Y guide pins for preventing a rotation of guide plate about the principal axis.

3. The electrical contacting apparatus of claim 1, wherein said support means includes a support bridge having a cavity extending therein from a bottom surface thereof and further having an aperture disposed in a top surface thereof connected with the cavity, wherein the cavity is larger than the aperture and angularly offset with respect to one another about the principal axis by a prescribed amount, said guide plate further being supported within the cavity with said electrical contact pad positioned within the aperture.

4. The electrical contacting apparatus of claim 3, further wherein the cavity in said support means includes a generally square cavity of a dimension slightly larger than the size of the guide plate, the aperture having a size dimension larger than said electrical contact pad, the cavity and aperture being angularly offset from each other about the principal axis by an amount on the order of 45 degrees, the cavity further having slots therein for receiving the guide pins of said guide plate, the guide pins preventing said guide plate from rotating about the principal axis, and said support means further including four compression springs disposed between said guide plate and an underside of the top surface of said support bridge within the cavity.

5. The electrical contacting apparatus of claim 1, wherein said contact actuation force means includes a diaphram actuated piston, the piston having a raised balancing center point thereon for engaging the center of the bottom surface of said guide plate.

6. The electrical contacting apparatus of claim 5, further wherein said contact actuation force means further includes a piston support bridge for supporting and guiding the diaphram actuated piston therein, further wherein the diaphram actuated piston includes an elongated oblong piston, and four compression springs disposed between the diaphram actuated piston and an underside of the top surface of the piston support bridge, wherein the raised balancing center point of the piston includes a raised bullet portion having a rounded contacting end which extends through an aperture in the top surface of the piston support bridge upon an actuation of the diaphram actuated piston.

7. The electrical contacting apparatus of claim 1, wherein said electrical contact pad includes a shorting pad, the shorting pad having a gold foil wrapped around a generally square block of flexible material and bonded to a magnetic base plate, said guide plate includes a generally square shape, wherein the shorting pad is mounted upon said guide plate such that the corners of the shorting pad are offset from the corners of the guide plate by an amount on the order of forty-five degrees, further wherein the guide pins include X-Y guide pins for preventing a rotation of guide plate about the principal axis, said support means includes a support bridge having a cavity extending therein from a bottom surface thereof and further having an aperture disposed in a top surface thereof connected with the cavity, wherein the cavity is larger than the aperture and angularly offset with respect to one another about the principal axis by a prescribed amount, said guide plate further being supported within the cavity with said electrical contact pad positioned within the aperture, and said contact actuation force means includes a diaphram actuated piston, the piston having a raised balancing center point thereon for engaging the center of the bottom surface of said guide plate.

8. A substrate processing apparatus having an electrical contactor characterized by a principal axis, said apparatus comprising:

an electrical contact pad;

a guide plate having side edges with guide pins extending radially outward from a center of each side edge, wherein said electrical contact pad is mounted and centered upon a top surface of said guide plate;

means for supporting said guide plate to enable a pivotal movement of said guide plate about a point on the principal axis; and means for providing a contact actuation force to a center of the bottom surface of said guide plate to maintain an equal force across said electrical contact pad in a direction of the principal axis, whereby said electrical contact pad provides a desired contacting force equally balanced across an entire contact area defined by an area of contact between said electrical contact pad and a substrate being contacted.

9. An method of electrically contacting a substrate with a contactor having a principal axis, said method comprising the steps of:

providing an electrical contact pad;

providing a guide plate having side edges with guide pins extending radially outward from a center of each side edge, wherein the electrical contact pad is mounted and centered upon a top surface of the guide plate;

providing means for supporting the guide plate to enable a pivotal movement of the guide plate about a point on the principal axis; and providing a contact actuation force to a center of the bottom surface of the guide plate to maintain an equal force across the electrical contact pad in a direction of the principal axis, whereby the electrical contact pad provides a desired contacting force equally balanced across an entire contact area defined by an area of contact between the electrical contact pad and the substrate being contacted.

10. The electrical contacting method of claim 9, wherein the electrical contact pad includes a shorting pad, the shorting pad having a gold foil wrapped around a generally square block of flexible material and bonded to a magnetic base plate, and the guide plate includes a generally square shape, wherein the shorting pad is mounted upon the guide plate such that the corners of the shorting pad are offset from the corners of the guide plate by an amount on the order of forty-five degrees, further wherein the guide pins include X-Y guide pins for preventing a rotation of guide plate about the principal axis.

11. The electrical contacting method of claim 9, wherein the support means includes a support bridge having a cavity extending therein from a bottom surface thereof and further having an aperture disposed in a top surface thereof connected with the cavity, wherein the cavity is larger than the aperture and angularly offset with respect to one another about the principal axis by a prescribed amount, the guide plate further being supported within the cavity with the electrical contact pad positioned within the aperture.

12. The electrical contacting method of claim 11, further wherein the cavity in the support means includes a generally square cavity of a dimension slightly larger than the size of the guide plate, the aperture having a size dimension larger than the electrical contact pad, the cavity and aperture being angularly offset from each other about the principal axis by an amount on the order of 45 degrees, the cavity further having slots therein for receiving the guide pins of the guide plate, the guide pins preventing the guide plate from rotating about the principal axis, and the support means further including four compression springs disposed between the guide plate and an underside of the top surface of the support bridge within the cavity.

13. The electrical contacting method of claim 9, wherein providing the contact actuation force includes providing a diaphram actuated piston, the piston having a raised balancing center point thereon for engaging the center of the bottom surface of the guide plate.

14. The electrical contacting method of claim 13, further wherein providing the contact actuation force further includes providing a piston support bridge for supporting and guiding the diaphram actuated piston therein, further wherein the diaphram actuated piston includes an elongated oblong piston, and four compression springs disposed between the diaphram actuated piston and an underside of the top surface of the piston support bridge, wherein the raised balancing center point of the piston includes a raised bullet portion having a rounded contacting end which extends through an aperture in the top surface of the piston support bridge upon an actuation of the diaphram actuated piston.

15. The electrical contacting method of claim 9, wherein the electrical contact pad includes a shorting pad, the shorting pad having a gold foil wrapped around a generally square block of flexible material and bonded to a magnetic base plate, the guide plate includes a generally square shape, wherein the shorting pad is mounted upon the guide plate such that the corners of the shorting pad are offset from the corners of the guide plate by an amount on the order of forty-five degrees, further wherein the guide pins include X-Y guide pins for preventing a rotation of guide plate about the principal axis, the support means includes a support bridge having a cavity extending therein from a bottom surface thereof and further having an aperture disposed in a top surface thereof connected with the cavity, wherein the cavity is larger than the aperture and angularly offset with respect to one another about the principal axis by a prescribed amount, the guide plate further being supported within the cavity with the electrical contact pad positioned within the aperture, and providing the contact actuation force includes providing a diaphram actuated piston, the piston having a raised balancing center point thereon for engaging the center of the bottom surface of the guide plate.

16. A method of electrically contacting a substrate during a substrate processing operation with a contactor having a principal axis, said method comprising the steps of:

providing an electrical contact pad;

providing a guide plate having side edges with guide pins extending radially outward from a center of each side edge, wherein the electrical contact pad is mounted and centered upon a top surface of the guide plate;

providing means for supporting the guide plate to enable a pivotal movement of the guide plate about a point on the principal axis; and providing a contact actuation force to a center of the bottom surface of the guide plate to maintain an equal force across the electrical contact pad in a direction of the principal axis, whereby the electrical contact pad provides a desired contacting force equally balanced across an entire contact area defined by an area of contact between said electrical contact pad and a substrate being contacted.

* * * * *